(12) United States Patent
Di Stefano

(10) Patent No.: US 9,151,551 B2
(45) Date of Patent: Oct. 6, 2015

(54) APPARATUS TO CONTROL DEVICE TEMPERATURE UTILIZING MULTIPLE THERMAL PATHS

(75) Inventor: Thomas H. Di Stefano, Monte Sereno, CA (US)

(73) Assignee: Centipede Systems, Inc., Santa Clara, CA (US)

( * ) Notice: Subject to any disclaimer, the term of this patent is extended or adjusted under 35 U.S.C. 154(b) by 717 days.

(21) Appl. No.: 13/411,573

(22) Filed: Mar. 4, 2012

(65) Prior Publication Data

US 2013/0068442 A1 Mar. 21, 2013

Related U.S. Application Data

(63) Continuation of application No. 11/725,091, filed on Mar. 16, 2007, now Pat. No. 8,151,872.

(51) Int. Cl.
| | |
|---|---|
| *F25B 29/00* | (2006.01) |
| *F28F 27/00* | (2006.01) |
| *F25B 49/02* | (2006.01) |
| *F25D 19/00* | (2006.01) |
| *F24H 9/00* | (2006.01) |
| *F25B 7/00* | (2006.01) |
| *F25D 17/02* | (2006.01) |
| *H01L 23/473* | (2006.01) |

(52) U.S. Cl.
CPC *F28F 27/00* (2013.01); *F24H 9/00* (2013.01); *F25B 29/00* (2013.01); *F25B 49/02* (2013.01); *F25D 19/00* (2013.01); *F25B 7/00* (2013.01); *F25B 2400/01* (2013.01); *F25B 2600/2521* (2013.01); *F25D 17/02* (2013.01); *H01L 23/473* (2013.01); *H01L 2924/0002* (2013.01); *H01L 2924/1433* (2013.01)

(58) Field of Classification Search
CPC ............ F28F 27/00; F25B 7/00; F25B 49/02; F25B 2400/01; F25B 2600/2521; F25B 29/00; F25D 17/02; F25D 19/00; F24H 9/00; H01L 23/473; H01L 2924/1433; H01L 2924/0002
USPC ......................................................... 165/253
See application file for complete search history.

(56) References Cited

U.S. PATENT DOCUMENTS

| | | | |
|---|---|---|---|
| 4,065,936 A | 1/1978 | Fenton et al. | |
| 4,784,213 A | 11/1988 | Eager et al. | |
| 4,945,980 A | 8/1990 | Umezawa | |
| 4,975,766 A | 12/1990 | Umezawa | |
| 5,198,752 A | 3/1993 | Miyata et al. | |
| 5,564,276 A | 10/1996 | Abadilla et al. | |
| 5,582,235 A * | 12/1996 | Hamilton et al. | ............. 165/263 |
| 5,844,208 A | 12/1998 | Tustaniwskyj et al. | |

(Continued)

*Primary Examiner* — Ljiljana Ciric
(74) *Attorney, Agent, or Firm* — Michael B. Einschlag

(57) ABSTRACT

Apparatus to control device temperature includes a thermal head fluid path in thermal contact with the device, a pump assembly, a temperature sensor in communication with a controller, and first, second and third valves operable in response to the controller wherein the fluid path receives thermal transfer fluid from a combined path and outputs it to the pump assembly, the pump assembly outputs the fluid to a first, a second and a third path, all connected to the combined path wherein the first path is in thermal contact with a heat assembly and the second path is in thermal contact with a cooling assembly, the temperature sensor senses a temperature of the fluid path, and the first, second and third valves are disposed in the first, second and third paths to control fluid flow therethrough, respectively.

13 Claims, 3 Drawing Sheets

(56) References Cited

U.S. PATENT DOCUMENTS

| | | |
|---|---|---|
| 5,918,469 A | 7/1999 | Cardella |
| 5,964,092 A | 10/1999 | Tozuka et al. |
| 5,977,785 A | 11/1999 | Burward-Hoy |
| 6,163,161 A * | 12/2000 | Neeb ................ 324/750.07 |
| 6,184,504 B1 | 2/2001 | Cardella |
| 6,239,602 B1 | 5/2001 | Nakagomi et al. |
| 6,257,319 B1 | 7/2001 | Kainuma et al. |
| 6,362,944 B1 | 3/2002 | Tustaniwskyj et al. |
| 6,389,225 B1 | 5/2002 | Malinoski et al. |
| 6,460,353 B2 | 10/2002 | Udobot et al. |
| 6,476,627 B1 | 11/2002 | Pelissier et al. |
| 6,489,793 B2 | 12/2002 | Jones et al. |
| 6,498,899 B2 | 12/2002 | Malinoski et al. |
| 6,518,782 B1 | 2/2003 | Turner |
| 6,526,768 B2 | 3/2003 | Wall et al. |
| 6,549,026 B1 | 4/2003 | DiBattista et al. |
| 6,593,761 B1 | 7/2003 | Fukasawa et al. |
| 6,615,598 B1 * | 9/2003 | Wang et al. ................ 62/197 |
| 6,617,868 B1 | 9/2003 | Needham |
| 6,636,062 B2 | 10/2003 | Gaasch et al. |
| 6,650,132 B2 | 11/2003 | Pelissier |
| 6,668,570 B2 * | 12/2003 | Wall et al. ................ 62/223 |
| 6,744,270 B2 | 6/2004 | Stone |
| 6,771,086 B2 | 8/2004 | Lutz et al. |
| 6,825,681 B2 | 11/2004 | Feder et al. |
| 6,862,405 B2 | 3/2005 | Malinoski et al. |
| 6,886,976 B2 | 5/2005 | Gaasch et al. |
| 6,975,028 B1 * | 12/2005 | Wayburn et al. ............ 257/718 |
| 6,984,064 B1 * | 1/2006 | Touzelbaev ................ 374/43 |
| 6,985,000 B2 | 1/2006 | Feder et al. |
| 6,993,922 B2 * | 2/2006 | Wall et al. ................ 62/223 |
| 7,000,691 B1 | 2/2006 | Weber |
| 7,017,358 B2 * | 3/2006 | Wayburn et al. ............ 62/115 |
| 7,062,934 B2 * | 6/2006 | Craps et al. ................ 62/259.2 |
| 7,100,389 B1 * | 9/2006 | Wayburn et al. ............ 62/259.2 |
| 7,199,597 B2 * | 4/2007 | Tustaniwskyj et al. ...... 165/80.3 |
| 7,254,957 B2 | 8/2007 | Weber et al. |
| 7,819,179 B2 * | 10/2010 | Hayashi et al. ................ 165/263 |
| 7,870,800 B2 * | 1/2011 | Di Stefano et al. .......... 73/866.5 |
| 7,951,750 B2 * | 5/2011 | Arai et al. ................ 503/227 |
| 8,025,097 B2 * | 9/2011 | Di Stefano et al. ........... 165/276 |
| 8,151,872 B2 * | 4/2012 | Di Stefano ................ 165/253 |
| 8,395,400 B2 * | 3/2013 | Nakamura ................ 324/750.08 |
| 8,720,875 B2 * | 5/2014 | Di Stefano et al. ............ 269/56 |
| 2003/0001605 A1 | 1/2003 | Jones et al. |
| 2003/0113106 A1 | 6/2003 | Hwang et al. |
| 2004/0051545 A1 | 3/2004 | Tilton et al. |
| 2005/0030052 A1 | 2/2005 | Beaman et al. |
| 2005/0151553 A1 | 7/2005 | Kabbani et al. |
| 2005/0241328 A1 * | 11/2005 | Craps et al. ................ 62/259.2 |
| 2007/0240870 A1 * | 10/2007 | Hayashi et al. ................ 165/253 |
| 2007/0240871 A1 * | 10/2007 | Hayashi et al. ................ 165/253 |

* cited by examiner

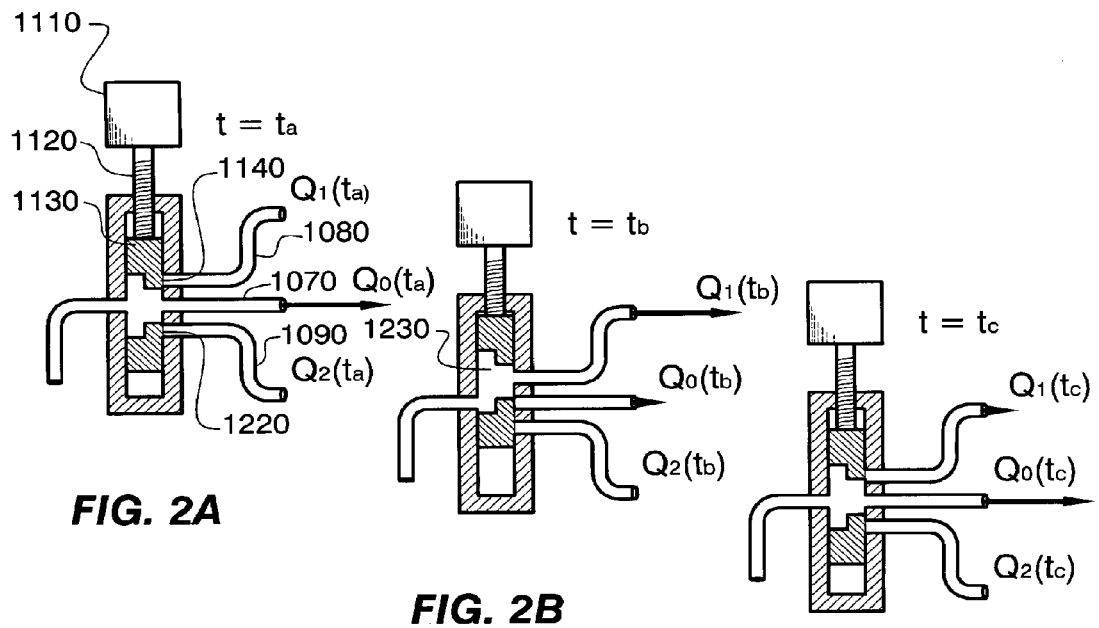
FIG. 2A
FIG. 2B
FIG. 2C
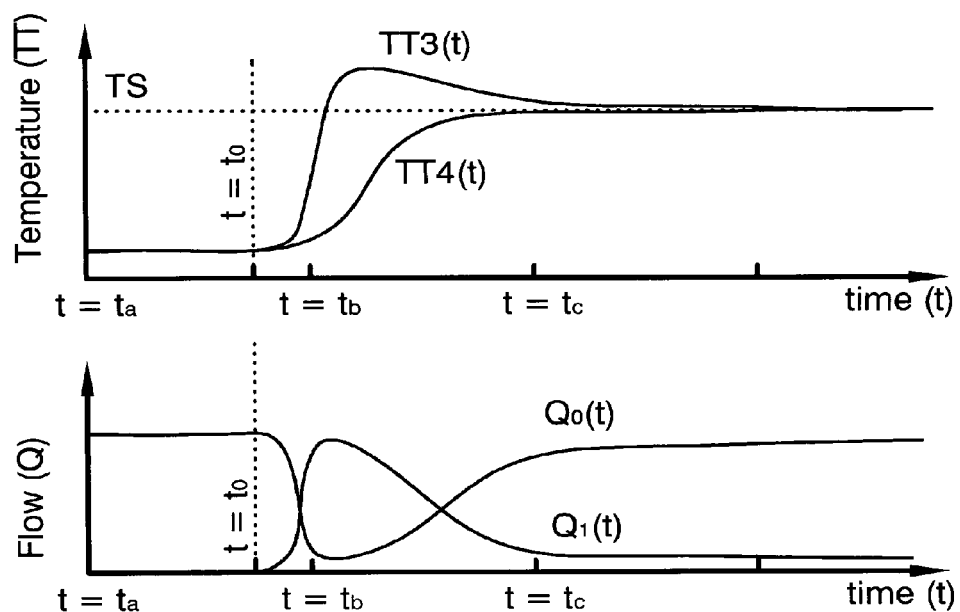
FIG. 2D

APPARATUS TO CONTROL DEVICE TEMPERATURE UTILIZING MULTIPLE THERMAL PATHS

This is a continuation of a patent application entitled "Method and Apparatus for Controlling Temperature" having Ser. No. 11/725,091 which was filed on Mar. 16, 2007 and which is incorporated herein in its entirety.

TECHNICAL FIELD OF THE INVENTION

One or more embodiments of the present invention relate to method and apparatus for controlling temperature, and more specifically to method and apparatus for controlling temperature of an electronic device during testing.

BACKGROUND OF THE INVENTION

Electronic devices such as semiconductor integrated circuits ("ICs") are typically tested under conditions that include, particularly for complex devices, several temperatures (for example, including temperature extremes). In addition, functional testing is performed on relatively expensive test equipment, and time taken to carry out such testing is important for economic reasons. Thus, time taken to establish test temperatures ought to be minimized to minimize testing time and cost entailed in using such test equipment.

In common testing practice, devices under test ("DUTs") are brought to a test temperature in a thermal soak step in a test sequence. In more recent testing practice, tests are carried out at several temperatures, such temperatures often including a low temperature that is well below room temperature. The use of such multiple test temperatures, and condensation of water at low temperatures, renders a thermal soak step impractical for helping to establish such multiple test temperatures. In addition, increasingly, DUTs are cycled through a set of test temperatures while they are mounted on a test head, which cycling takes up valuable test equipment time.

Recently, in response to the above, considerable effort has been expended to find methods to establish and cycle DUT temperature rapidly during a test sequence while the DUT is mounted on test equipment (referred to herein as rapid thermal conditioning of a DUT).

One commonly used method to provide rapid thermal conditioning of a DUT entails placing a fluid-cooled test head in contact with a DUT, where the temperature of the test head is modulated by resistive heating, for example, utilizing a resistive heating element attached directly to the test head. In accordance with this method, to raise the temperature of the test head, additional current is passed through the resistive heating element. Likewise, to lower the temperature of the test head, current passed through the test head is reduced. This method is inefficient in that the test head is both heated and cooled at the same time. Further, compromises in design that enable resistive heating to change the temperature of the test head also act to reduce the thermal efficiency of the test head. In particular, the temperature of the resistively heated test head is typically controlled by: (a) sensing the temperature of the DUT, and (b) using this temperature to control current supplied to the test head. In further such embodiments, power supplied to the DUT is also sensed, and the power supplied to the DUT is used to: (a) anticipate temperature changes of the DUT, and (b) accommodate such anticipated temperature changes by adjusting current supplied to the resistive heating element attached directly to the test head.

Another method to provide rapid thermal conditioning of a DUT entails first cooling, and subsequently heating, a stream of air that is directed onto the DUT, where heating of the stream of air is done by resistive heating thereof. Because of this, heating is relatively rapid. In addition, the method of first cooling and then heating a flow of air is inefficient, and limits the efficacy of the method. In further addition, the large amount of energy expended in both heating and cooling the air (or other thermal transfer fluid) limits the amount of air that can be processed in a practical system.

Yet another method to provide rapid thermal conditioning of a DUT entails mixing hot and cold thermal transfer fluids to provide a thermal transfer fluid at a predetermined temperature to a heat exchanger thermally connected to the DUT. In accordance with this method, by adjusting the ratio of flows of the thermal transfer fluids, the temperature of the DUT may be controlled within a band of temperatures between a temperature of the hot thermal transfer fluid and a temperature of the cold thermal transfer fluid. However, because a hot thermal transfer fluid must be mixed with a cold thermal transfer fluid to obtain a thermal transfer fluid having an intermediate temperature, this mixing process is inefficient.

In light of the above, there is a need in the art for method and apparatus that solves one or more of the above-identified problems.

SUMMARY OF THE INVENTION

One or more embodiments of the present invention satisfy one or more of the above-identified needs. In particular, one embodiment of the present invention is an apparatus to control a temperature of a device that comprises: a thermal head fluid path adapted to be in thermal contact with the device, the thermal head fluid path being disposed to receive thermal transfer fluid from a combined path and to output thermal transfer fluid fluidly to a pump assembly; a temperature sensor in communication with a controller and being operable to sense a temperature in response to the thermal head fluid path; the pump assembly being disposed to output the thermal transfer fluid fluidly to each of a first path, a second path, and a third path; the first path being fluidly connected at a first end to the output of the pump assembly and at a second end to the combined path, the first path being in thermal contact with a heating assembly; the second path being fluidly connected at a first end to the output of the pump assembly and at a second end to the combined path, the second path being in thermal contact with a cooling assembly; a third path being fluidly connected at a first end to the output of the pump assembly and at a second end to the combined path; and a first valve in the first path, a second valve in the second path, and a third valve in the third path; wherein the first, second, and third valves are operable, in response to the controller, to control thermal transfer fluid flow through the first, second, and third paths.

BRIEF DESCRIPTION OF THE DRAWING

FIGS. 2A, 2B, and 2C are schematic representations of a fluid mixing valve shown in FIG. 1 at times $t=t_a$, $t=t_b$, and $t=t_c$, respectively;

FIG. 2D shows graphs of temperatures $TT3(t)$ and $TT4(t)$ and flows $Q_0(t)$ and $Q_1(t)$ as a function of time.

DETAILED DESCRIPTION

Figure 1:
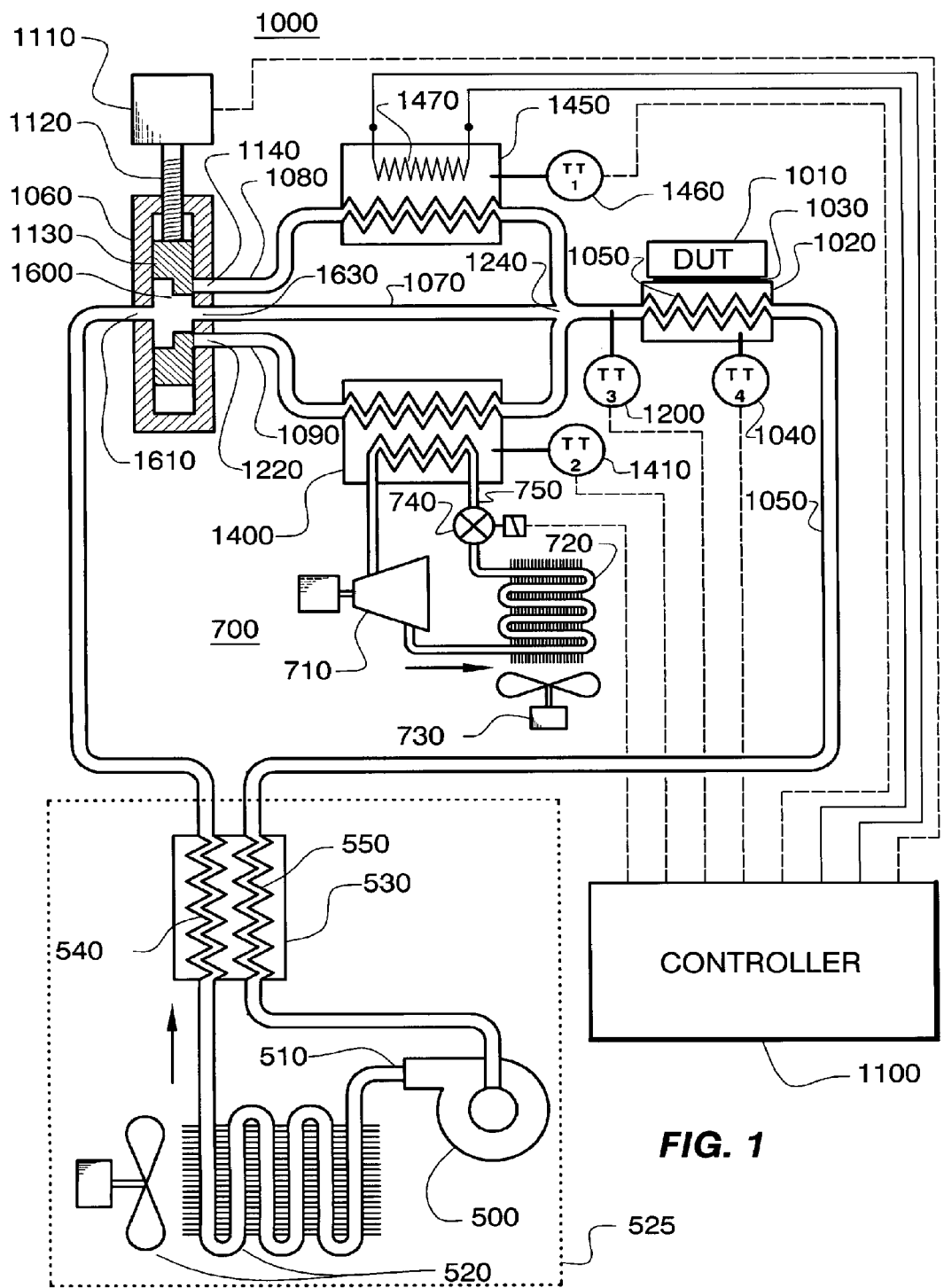
FIG. 1 is a schematic representation of an apparatus useful to control temperature of a device under test ("DUT"), which apparatus is fabricated in accordance with one or more embodiments of the present invention.

FIG. 1 is a schematic representation of apparatus 1000 that is fabricated in accordance with one or more embodiments of the present invention, which apparatus 1000 is useful to control temperature (for example and without limitation, set and maintain temperature) of device under test 1010 ("DUT 1010") (such as, for example and without limitation, a microelectronic device and more specifically, a semiconductor integrated circuit). To perform testing using apparatus 1000: (a) DUT 1010 is mounted in a fixture, for example and without limitation, a socket, that provides signal contact, for example and without limitation, electrical contact, between DUT 1010 and automatic test equipment ("ATE"), for example and without limitation, electronic circuitry that provides test signals to, and receives responses from, DUT 1010; and (b) DUT 1010 is maintained in good thermal contact with thermal head 1020 that controls the temperature of DUT 1010.

In accordance with one or more embodiments of the present invention, the temperature of DUT 1010 is established (for example, is set and controlled) by changing the temperature of thermal head 1020, and the temperature of thermal head 1020 is established (for example, set and controlled), in turn, by flowing a thermal transfer fluid through thermal head 1020 (where the term "fluid" will be understood to encompass both liquids and gases). In accordance with one or more embodiments of the present invention, thermal head 1020 comprises: (a) a plate having a surface area configured to couple to DUT 1010 to transfer heat to and from DUT 1010 by way of heat conduction; and (b) a heat exchanger connected to the plate to set a temperature of the surface area of the plate by heat conduction. In accordance with one or more such embodiments, the plate spreads heat to present a uniform temperature to DUT 1010. In addition, and in accordance with one or more such embodiments, the plate has low thermal capacity (i.e., the plate is incapable of storing much thermal energy) and high thermal conductivity (i.e., the plate is capable of transferring thermal energy rapidly). Rapid rates of change of temperature are enabled, in part, by minimizing the heat capacity of the plate as much as practicable. However, a need to reduce the heat capacity of the plate should be balanced against a need for high thermal conductivity so that heat may be more rapidly transferred between the plate and the heat exchanger. This balancing enables the plate to achieve rapid thermal equilibrium with the heat exchanger when the temperature of the heat exchanger is changed. In accordance with one or more embodiments of the present invention, a balance between low heat capacity and high thermal conductivity is struck by manufacturing the plate from a thin sheet (for example and without limitation, 0.060 inches thick) of a highly thermally conductive material such as, for example and without limitation, copper. In accordance with one or more embodiments of the present invention, thermal head 1020 is a part of a test head (not shown for sake of ease of understanding one or more embodiments of the present invention).

As shown in FIG. 1, and in accordance with one or more such embodiments, to ensure good thermal contact between DUT 1010 and the plate, optional conductive coatings and structures may be placed on the plate to improve thermal conductance to DUT 1010 (improving thermal conductance improves temperature set and control performance). For example, a contacting material may be attached to the plate to contact DUT 1010—for example and without limitation, a compliant sheet of metal impregnated plastic can be attached to the DUT 1010 side of the plate. However, the contacting material need not be as thermally conductive as the material of the plate. In further addition, optionally, fixture (socket) assemblies used to receive a DUT may allow helium gas to be injected (this allows helium to displace air between thermal head 1020 and DUT 1010) since helium is more thermally conductive than air, and thereby, to improve performance. In accordance with one or more embodiments of the present invention, the plate is substantially planar since, in practice, most DUTs have a flat or planar lid or case that serves as a mating surface. Of course, the size and shape of the contact surface of the thermal head may be configured to mate with a size and shape of the particular DUT. Alternatively, a suitably configured mating element, formed from a thermal conductor, can be placed between thermal head 1020 and DUT 1010 (a mating element may be desirable to accommodate specific physical characteristics of the DUT or to concentrate heat transfer in certain areas of the DUT). As such, it should be understood that the term plate is used to refer to any device or portion of a device that uniformly spreads heat. Thus, in accordance with one or more such embodiments of the present invention, thermal interface material 1030 (for example and without limitation, a material such as eGRAF HiTherm available from GrafTech International Ltd. of Cleveland, Ohio) may be disposed between, and in thermal contact with, thermal head 1020 of the test head and DUT 1010 to increase thermal coupling between thermal head 1020 and DUT 1010.

As indicated in FIG. 1, thermal head 1020 has conduits or fluid channel(s) through which thermal transfer fluid flows. In accordance with one or more such embodiments, such channels may be microchannels, for example and without limitation, for use preferably when the fluid is a gas. For example and without limitation, in accordance with one or more such embodiments, thermal head 1020 comprises a block of thermally conductive material with microchannels for fluid flow within the block. In addition, and in accordance with one or more further embodiments of the present invention, thermal head 1020 includes a set of channels that are interdigitated so that walls between the channels are relatively thin to maximize thermal conductivity, reduce thermal gradients, and promote uniform temperatures across a surface of a plate that overlays the interdigitated channels. In accordance with one or more such further embodiments of the present invention, the set of channels includes a single serpentine channel that switches back and forth. In accordance with one or more still further embodiments of the present invention, the plate may be a lid for covering the interdigitated channels—using the plate to cover the channels enables the plate to contact the thermal transfer fluid to promote heat transfer between the thermal transfer fluid, as well as between DUT 1010 and thermal head 1020.

In accordance with one or more embodiments of the present invention, thermal head 1020 may be integrated into an ATE so that thermal head 1020 is in good thermal contact with DUT 1010 during functional testing. In addition, and in accordance with one or more embodiments of the present invention, depending on whether the ATE is for use in testing packaged devices or bare dies (unpackaged bare chips), an electrical test path for electrically testing DUT 1010 may be either a test head for testing packaged semiconductor devices or a prober for testing dies of a semiconductor wafer, respectively. Still further, in accordance with one or more embodiments of the present invention, the ATE may comprise a device handler that includes a chuck that receives DUT 1010. In such a case, depending on whether the ATE is for testing packaged devices or bare dies, the chuck may be capable of receiving and holding either a packaged semiconductor device or a semiconductor wafer, respectively.

In accordance with one or more embodiments of the present invention, temperature TT4 of thermal head 1020 may be sensed using any one of a number of methods that are well known to those of ordinary skill in the art including use of thermocouple sensors, thermistors, resistive sensors, diode sensors, IR emission sensors, and any other means for sensing temperature. For example and without limitation, thermal head 1020 may include a suitably placed channel configured to carry a thermocouple sensor wire that communicates with, and enables, controller 1100 to monitor temperature TT4 of thermal head 1020.

As further shown in FIG. 1, temperature TT4 of thermal head 1020 is measured by sensor 1040 comprising, for example, and without limitation, a type K thermocouple junction, in thermal contact therewith—as further indicated by FIG. 1, temperature TT4 is transferred to controller 1100 (sensor 1040 and controller 1100 are in communication) where controller 1100 comprises, for example, and without limitation, an Omron CPM2C microprogrammable controller having a CPM2C-TS001 thermocouple sensor input module (available from Omron Electronics, LLC of Schaumburg, Ill.). As one of ordinary skill in the art can readily appreciate, this transfer may occur by having sensor 1040 transmit measurements to controller 1100 or by having controller 1100 poll sensor 1040 in accordance with any one of a number of methods that are well known to those of ordinary skill in the art. In accordance with one or more such embodiments, temperature TT4 of thermal head 1020 is regulated by thermal transfer fluid flowing in circuit 1050 through thermal head 1020. In accordance with one or more such embodiments, the thermal transfer fluid flowing through thermal head 1020 is circulated in a closed loop system that conserves heat stored in the thermal transfer fluid, thereby increasing the energy efficiency of apparatus 1000.

In accordance with one or more embodiments of the present invention, the thermal transfer fluid ought to: (a) have a low and relatively flat viscosity over the desired temperature range so that it can be pumped; (b) have a thermal capacity which is high enough over the desired temperature range so that it can serve as an efficient heat exchange medium; (c) optionally, be a safe chemical so that no injuries will result if any part of the human body is exposed thereto; and (d) optionally, be a dielectric so that it will not electrically short any circuit onto which it might be spilled. For example and without limitation, the thermal transfer fluid may include, water, glycol-water mixtures, water-salt mixtures, FLUORINERT™ a fluorocarbon based fluid (available from 3M Corporation of St. Paul, Minn.), GALDEN® fluid (available from Solvay Chemicals, Inc. of Houston, Tex.), silicone oils, hydrocarbon oils, compressed air, CO2, helium, nitrogen, helium-hydrogen, and other gas mixtures or thermal transfer fluids. In accordance with one or more such embodiments of the present invention, the hydrostatic pressure of the thermal transfer fluid as it flows through thermal head 1020 is set to provide a flow rate which results in good thermal efficiency of heat transfer to and from thermal head 1020 (the flow rate of a thermal transfer fluid may be adjusted since the temperature of a surface area of a plate to which DUT 1010 is contacted has a functional relationship to the flow rate and temperature of the thermal transfer fluid). As such, this is largely a function of the thermal head design used in a particular application. In addition, flow rates may be varied across a temperature range, with a higher flow rate being used with higher thermal transfer fluid temperatures and a lower flow rate used for lower temperatures due to a typically higher viscosity. For example and without limitation, for an embodiment using helium as the thermal transfer fluid, a hydrostatic pressure of between 0 psig and 600 psig, and preferably between 80 psig and 200 psig, may be used (where psig is pressure is pounds per square inch gage—above atmospheric pressure). In accordance with one or more such embodiments of the present invention, for example and without limitation, the thermal transfer fluid is dry nitrogen at a pressure of about 150 psig as measured, for example and without limitation, at exit port 510 of pump 500 that circulates the thermal transfer fluid through circuit 1050. In accordance with one or more such embodiments, a hermetically sealed scroll compressor available from Copeland Corporation of Sidney, Ohio may be used to circulate the high pressure nitrogen gas (as is well known in the art, a scroll compressor is a type of gas compressor used in refrigeration units). In accordance with one or more such embodiments, the high pressure nitrogen circulates at a rate of about three (3) cubic feet per minute. Further, in accordance with one or more embodiments of the present invention, the thermal transfer fluid may be pressurized to prevent cavitation in liquids or to increase the heat capacity of gas phase thermal transfer fluids. Still further, in accordance with one or more embodiments of the present invention, the flow rate of the thermal transfer fluid may be varied by pump 500 in response to signals sent from controller 1100.

As shown in FIG. 1, and in accordance with one or more embodiments of the present invention, high pressure nitrogen output from exit port 510 of compressor 500 passes through fan-assisted, convective cooler 520 (i.e., fan-driven cooler of thermal transfer fluid in tubing) to remove excess heat caused by compression of the nitrogen. However, it should be understood that further embodiments exist wherein such cooling of nitrogen output from exit port 510 may not be necessary, for example and without limitation, in embodiments having low flow designs where compressor heating is not significant.

As further shown in FIG. 1, upon exiting convective cooler 520, the high pressure nitrogen passes through secondary side 540 of counter-flow heat exchanger 530, and then to fluid mixing valve 1060 (also referred to herein as proportioning valve 1060). In accordance with one or more embodiments of the present invention, heat is transferred between thermal transfer fluid flowing in fluid channel(s) in secondary side 540 and thermal transfer fluid flowing in fluid channel(s) in primary side 550 (sometimes referred to as the input side of a counter-flow heat exchanger) of counter-flow heat exchanger 530, thereby bringing thermal transfer fluid flowing out of secondary side 540 (sometimes referred to as the output side of a counter-flow heat exchanger) to a temperature near that of thermal transfer fluid flowing into primary side 550. In accordance with one or more embodiments of the present invention, a counter-flow heat exchanger may be designed so that the temperature of thermal transfer fluid flowing out from secondary side 540 will be within several degrees centigrade of the temperature of thermal transfer fluid flowing into primary side 550, notwithstanding a temperature change of as much as 100° C. in thermal transfer fluid as it flows through secondary side 540 (such as units available from FlatPlate, Inc. of York, Pa.). In accordance with one or more such embodiments, because of such a thermal efficiency, counter-flow heat exchanger 530 is able to transfer thermal energy from thermal transfer fluid entering primary side 550 to thermal transfer fluid entering secondary side 540, thereby conserving thermal energy in thermal transfer fluid flowing in circuit 1050. Advantageously, in accordance with one or more such embodiments of the present invention, conservation of thermal energy in thermal transfer fluid circulating in circuit 1050 applies to a case where the temperature of the thermal transfer fluid is higher than the ambient temperature as well as to a case where the temperature of the thermal transfer fluid is lower than the ambient temperature. By way of example, assume that: (a) nitrogen at 150 psig enters primary side 550 of counter-flow heat exchanger 530 at 100° C. and exits secondary side 540 at a temperature of about 97° C.; (b) a scroll compressor embodiment of pump 500 operates in an ambient temperature of 27° C.; and (c) nitrogen output from the compressor is cooled by convective cooler 520 to a temperature of about 30° C. before it enters secondary side 540 of counter-flow heat exchanger 530. As is illustrated by this example, pump assembly 525 comprising counter-flow heat exchanger 530, scroll compressor 500, and fan-assisted, convective cooler 520 is able to circulate thermal transfer fluid with a small loss of thermal energy from the thermal transfer fluid, notwithstanding operation of compressor 500 at ambient temperature and compressive heating of the thermal transfer fluid.

As further shown in FIG. 1, and in accordance with one or more embodiments of the present invention, thermal transfer fluid flows from pump assembly 525 to proportioning valve 1060 that distributes the thermal transfer fluid between straight-through path 1070, hot path 1080, and cold path 1090. In FIG. 1, proportioning valve 1060 is shown in a neutral position in which thermal transfer fluid is distributed entirely to straight-through path 1070. In this configuration, the thermal transfer fluid flows directly through thermal head 1020. Thus, in the configuration of apparatus 1000 shown in FIG. 1, thermal transfer fluid flows continuously in circuit 1050 through thermal head 1020, pump assembly 525, proportioning valve 1060, straight-through path 1070, and thence back to thermal head 1020. In an ideal quiescent state in which: (a) counter-flow heat exchanger 530 is 100% efficient; (b) DUT 1010 dissipates no energy; and (c) the various components of apparatus 1000 are thermally insulated, then, the temperature of the circulating thermal transfer fluid remains constant in time. As a result, no heat would need be added to, or taken from, the thermal transfer fluid to maintain temperature in this ideal quiescent state. However, in accordance with one or more embodiments of the present invention, as will be described below, deviations from the ideal quiescent state are accommodated by adding heat to the circulating thermal transfer fluid by routing a portion of the thermal transfer fluid through hot path 1080, or by removing heat from the circulating thermal transfer fluid by routing a portion of the thermal transfer fluid through cold path 1090.

In accordance with one or more embodiments of the present invention, if power dissipated by DUT 1010 is increased, the temperature of DUT 1010 is maintained constant by mixing a controlled amount of thermal transfer fluid from cold path 1090 into the stream of thermal transfer fluid flowing in straight-through path 1070. In accordance with one or more such embodiments, a small increase of temperature TT4 of thermal head 1020 due to power dissipation in DUT 1010 is detected by sensor 1040 and noted by controller 1100. In response to this detected increase, controller 1100 causes a signal (for example, pulses) to be sent to stepper motor 1110, which signal causes stepper motor 1110 to rotate lead screw 1120 and, thereby, to move valve slider 1130 attached thereto in a downward direction. As a result, valve slider 1130 partially opens exit port 1220 of proportioning valve 1060 leading to cold path 1090 by a controlled amount. It should be noted that stepper motor 1110, lead screw 1120, and proportioning valve 1060 may also be referred to herein as a valve assembly that operates in response to controller 1100, and stepper motor 1110, lead screw 1120, and valve slider 1130 may also be referred to herein as a valve slider assembly that operates in response to controller 1100. As one of ordinary skill in the art can readily appreciate, the controlled amount can be determined routinely and without undue experimentation depending on the properties of the thermal transfer fluid such as heat capacity and flow rate. As a result, a portion of the circulating thermal transfer fluid flows through cold path 1090 to mix into the stream of thermal transfer fluid from straight-through path 1070, thereby reducing temperature TT3 sensed by sensor 1200 (as further indicated by FIG. 1, temperature TT3 is transferred to controller 1100, for example and without limitation, in the manner described above regarding temperature TT4). This reduction of the temperature of the circulating thermal transfer fluid causes a reduction in the temperature of thermal head 1020, thereby acting to maintain DUT 1010 at a nearly constant temperature. The principles of using feedback from a detected temperature to set and maintain a temperature are well known in the art, a commonly understood example being thermostatic control of room temperature by feedback control of a furnace. In addition, and in accordance with one or more embodiments of the present invention, electrical circuits, using analog components, digital components, or a combination may be used to implement controller 1100 and to carry out its functionality described herein. For example, and without limitation, controller 1100 may include a microprocessor that is programmed using any one of a number of methods that are well known to those of ordinary skill in the art. In accordance with one or more such embodiments, software implementations can be written in any suitable language, including without limitation high-level programming languages such as C+, mid-level and low-level languages, assembly languages, application-specific or device-specific languages, ladder languages, and graphical languages. In further addition, such software can run on a general purpose computer such as a Pentium, an application specific pieces of hardware, or other suitable devices. In addition to using discrete hardware components in a logic circuit, the logic may also be performed by an application specific integrated circuit ("ASIC") or other device. In further addition, various embodiments will also include hardware components which are well known to those of ordinary skill in the art such as, for example and without limitation, connectors, cables, and the like. Moreover, at least part of this functionality may be embodied in computer readable media (also referred to as computer program products) such as, for example and without limitation, magnetic, magnetic-optical, and optical media, used in programming an information-processing apparatus to perform in accordance with one or more embodiments of the present invention. This functionality also may be embodied in computer readable media, or computer program products, such as a transmitted waveform to be used in transmitting the information or functionality.

In another deviation from an ideal quiescent state, apparatus 1000 may be used to raise the temperature of DUT 1010 by a controlled amount. The sequence of events involved in raising the temperature of DUT 1010 is best understood by reference to FIGS. 2A-2C which show positions of proportioning valve 1060 at times ta, tb, and tc, respectively. In a quiescent state at ta, as shown in FIG. 2A, valve slider 1130 is in a mid-position in which thermal transfer fluid is channeled into straight-through path 1070. At time t0, controller 1100 causes valve slider 1130 of proportioning valve 1060 to be moved upward by activating stepper motor 1110 to turn lead screw 1120 holding valve slider 1130. Aperture 1230 in valve slider 1130 uncovers top exhaust port 1140 of valve slider 1130, thereby allowing a regulated amount of thermal transfer fluid to flow into hot path 1080 where it is heated before rejoining the flow of thermal transfer fluid from straight-through path 1070 at junction 1240 (refer to FIG. 1).

A configuration of proportioning valve 1060 after opening a flow to hot path 1080 is shown in FIG. 2B at time t=tb. In addition, FIG. 2D shows graphs of temperatures $TT3(t)$ and $TT4(t)$, and of flows $Q0(t)$ and $Q1(t)$ as a function of time ($Q0(t)$ is flow in straight-through path 1070 and $Q1(t)$ is flow in hot path 1080). As one can readily appreciate from FIG. 2D, flow $Q1(t)$ of thermal transfer fluid in hot path 1080 increases with time after controller 1100 causes proportioning valve 1060 to move at t=t0. Correspondingly, temperature $TT3(t)$ of the combined flow of thermal transfer fluid, as measured at sensor 1200 (refer to FIG. 1), increases with time after t=t0. Further, as thermal head 1020 is heated by the flow of thermal transfer fluid therethrough, temperature $TT4(t)$ of thermal head 1020 increases toward temperature $TT3(t)$ of the thermal transfer fluid. Flow $Q1(t)$ of thermal transfer fluid in hot path 1080 further increases with time as controller 1100 causes valve slider 1130 to be moved to open top exhaust port 1140 to hot path 1080, thereby increasing temperature $TT3(t)$ of the combined flow above a predetermined set point temperature TS. This "overshoot" of temperature $TT3(t)$ of the thermal transfer fluid above set point temperature TS accelerates the rise in temperature $TT4(t)$ of thermal head 1020, thereby enabling the temperature $TT4(t)$ to reach its set point temperature more rapidly. The use of "overshoot" of a forcing function is well known in the art of thermal control systems, where "overshoot" is commonly used to reduce the time needed to reach a set temperature. As temperature $TT4(t)$ of thermal head 1020 approaches set point temperature TS, controller 1100 causes valve slider 1130 to be adjusted to moderate flow $Q1(t)$ of thermal transfer fluid through hot path 1080, while increasing flow $Q0(t)$ through straight-through path 1070. At time t=tc, the temperature of thermal head 1020 is within an acceptable predetermined tolerance band of set point temperature TS. Then, controller 1100 causes valve slider 1130 to be moved to allow a small flow of thermal transfer fluid through hot path 1080, as shown in FIG. 2C, to: (a) maintain temperature $TT4(t) \approx TS$; and (b) offset heat loss in counter-flow heat exchanger 530 and heat loss due to imperfect insulation along circulation path 1050. Note that in the example discussed above and illustrated in FIGS. 2A-2D, for ease of understanding one or more embodiments of the present invention, flow $Q2(t)$ in cooling path 1090 is set to zero. However, in practice, and in accordance with one or more embodiments of the present invention, a small amount of thermal transfer fluid flow $Q2(t)$ may be allowed in order to maintain operation of refrigeration unit 700 and to prevent floodback of refrigerant into compressor 710.

In accordance with one or more embodiments of the present invention, the temperatures of hot path 1080 and cold path 1090, respectively, may be regulated to assist in controlling temperature TT4 of thermal head 1020 more effectively. In accordance with one or more such embodiments, and as shown in FIG. 1, temperature TT2 of cold path 1090 (i.e., TT2 is the temperature of heat exchanger 1400 as measured by sensor 1410 in thermal contact therewith—as further indicated by FIG. 1, temperature TT2 is transferred to controller 1100, for example and without limitation, in the manner described above regarding temperature TT4) is established by a refrigeration unit 700 comprising: (a) compressor 710; (b) air-cooled, condenser 720 with associated fan 730; (c) expansion valve 740; and (d) evaporation tube 750 that is thermally connected to cold path 1090 by heat exchanger 1400 (as indicated in FIG. 1, heat exchanger 1400 has fluid channel(s) for thermal transfer fluid flowing therethrough in cold path 1090 and for refrigerant flowing through refrigeration unit 700). In accordance with one such embodiment of the present invention, compressor 710 and condenser 720 with fan 730 are contained in a ⅓ HP COPELAND® refrigeration unit charged with type R404A refrigerant that is available from Emerson Climate Technologies, Inc. of St. Louis, Mo.; and expansion valve 740 is a Sporlan bipolar, stepper-controlled valve available from Sporlan Division—Parker Hannifin Corporation of Cleveland, Ohio (www.sporlan.com) which is connected to drive electronics in controller 1100. In accordance with one or more such embodiments, by way of example, an increase in power dissipation in DUT 1010 is offset by an increase in flow of thermal transfer fluid through cold path 1090, thereby slightly warming elements in cold path 1090. To compensate for such warming, controller 1100 sends a signal that causes stepper-controlled, expansion valve 740 to be actuated to release additional refrigerant into expansion tube 750, thereby providing additional cooling to offset warming caused by the increase in power dissipation in DUT 1010. One of ordinary skill in the art will appreciate that embodiments of the present invention are not limited to the described method and components to establish a cold path, and that further embodiments of the present invention exist wherein a cold path may be fabricated which utilize, for example and without limitation, thermoelectric coolers, thermoelectric coolers linked to a cold plate, two-stage refrigeration units, vortex coolers, and so forth.

In accordance with one or more embodiments of the present invention, and as shown in FIG. 1, temperature TT1 of hot path 1080 (i.e., TT1 is the temperature of heat exchanger 1450 as measured by sensor 1460 in thermal contact therewith—as further indicated by FIG. 1, temperature TT1 is transferred to controller 1100, for example and without limitation, in the manner described above regarding temperature TT4) is regulated by dissipation of electrical power in heat exchanger 1450 through which thermal transfer fluid flows in hot path 1080. In accordance with one or more such embodiments, electrical current is passed through resistive cartridge heater 1470 (for example, one or more resistive cartridge heaters available from Omega Corporation of Stamford Conn.) that is embedded in heat exchanger 1450 which has fluid channel(s) for thermal transfer fluid in hot path 1080. In accordance with one or more embodiments of the present invention, controller 1100 causes current to be supplied to heater 1470 in response to detection of condition(s) that require additional heat in hot path 1080. In accordance with one or more such embodiments, temperature TT1 of hot path heat exchanger 1450 detected by sensor 1460 is used by controller 1100 to control operation of apparatus 1000 described above.

In accordance with one or more embodiments of the present invention, proportioning valve 1060 shown in FIG. 1 comprises manifold 1600 having one input port 1610 on a first side, and three output ports 1140, 1630, and 1220 on a second side. As was described above, valve slider 1130 is moved by lead screw 1120 which is rotated by stepper motor 1110 to open and close access between input port 1610 and output ports 1140, 1630, and 1220 by incrementally varying amounts of motion. In accordance one or more embodiments, both output port 1140 to hot path 1080 and output port 1220 to cold path 1090 are not opened at the same time. Although not shown, O-ring seals may be used around each of input port 1610 and output ports 1140, 1630, and 1220 to reduce leakage of thermal transfer fluid. It should be understood by one of ordinary skill in the art that further embodiments of the present invention exist where a proportioning valve may have two independently controlled sliding plate valves where one such valve is used to proportion flow between a straight-through path and a hot path, and another such valve is used to proportion flow between a straight-through path and a cold path. In addition, it should be further understood by one of ordinary skill in the art that further embodiments of the present invention exist where three proportioning valves may be used wherein one of such valves is used to regulate flow in a hot path, one to regulate flow in a cold path, and one to regulate flow in a straight-through path. In addition, in light of the above, one of ordinary skill in the art will readily appreciate that further embodiments of the present invention exist utilizing any one of a number of methods and apparatus to proportion fluid flow among parallel paths.

As shown in FIG. 1, straight-through path 1070 is shown as a channel from proportioning valve 1060 to junction 1240 of hot path 1080, cold path 1090, and straight-through path 1070. A path from junction 1240 to thermal head 1020 may be referred to as a combined path for flow of thermal transfer fluid from hot path 1080, cold path 1090, and straight-through path 1070. However, further embodiments of the present invention exist wherein straight-through path 1070 is modified to accelerate controlled changes in temperature of thermal head 1020 and to increase its heating and cooling capacity. In accordance with one or more such embodiments, a counter-flow heat exchanger may be disposed in straight-through path 1070 (in place of, or in addition to, counter-flow heat exchanger 530) to recover heat from the thermal transfer fluid flowing out from thermal head 1020 (i.e., thermal transfer fluid flowing into channel 1055 shown in FIG. 1). In accordance with one such embodiment, thermal transfer fluid exhausted from thermal head 1020 would pass through a primary side of the counter-flow heat exchanger and thermal transfer fluid flowing between proportioning valve 1060 and junction 1240 would pass through a secondary side of the counter-flow heat exchanger. In accordance with one or more such embodiments, the counter-flow heat exchanger in straight-through path 1070 would accomplish a function similar to that accomplished by counter-flow heat exchanger 530, particularly near equilibrium where no thermal transfer fluid flows through hot path 1080 or cold path 1090. In addition, in light of the above, one of ordinary skill in the art will readily appreciate that further embodiments of the present invention exist utilizing any one of a number of methods and apparatus for thermal conditioning to modify temperature of thermal transfer fluid in the straight-through path.

As shown in FIG. 1, and in accordance with one or more embodiments of the present invention, thermal transfer fluid from each of hot path 1080, cold path 1090, and straight-through path 1070 are mixed at junction 1240. As one of ordinary skill in the art can readily appreciate, check valves (not shown) or flow control valves may be disposed in one or more paths, for example and without limitation, before junction 1240 to prevent reverse flow of the thermal transfer fluid. In addition, and in accordance with one or more further embodiments of the present invention, additional heat may be added to, or removed from, the thermal transfer fluid after confluence at junction 1240 to trim the temperature of the thermal transfer fluid flowing to thermal head 1020 using any one of a number of mechanisms. For example and without limitation, a resistive heater may be disposed in thermal contact with the combined path leading to thermal head 1020 to provide a mechanism to add a controlled amount of heat to the thermal transfer fluid, wherein electrical current applied to the resistive heater is regulated by controller 1100 according to any one of a number of feedback algorithms that are well known to those of ordinary skill in the art of temperature control. In further addition, and in accordance with one or more further embodiments of the present invention, temperature TT4($t$) of thermal head 1020 is regulated by routing the thermal transfer fluid so that it flows from junction 1240, though a secondary side of a counter-flow heat exchanger (not shown), and then to thermal head 1020. In accordance with one or more such embodiments, thermal transfer fluid exhausted (i.e., output) from thermal head 1020 is routed through a primary side of the counter-flow heat exchanger, and from there to pump assembly 525. In accordance with one or more further such embodiments, an array of thermoelectric coolers ("TECs") may be disposed between a primary side and a secondary side of the counter-flow heat exchanger so that one set of junctions of the TECs is thermally connected to the primary side of the counter-flow heat exchanger, and the opposite set of junctions of the TECs is thermally connected to the secondary side of the counter-flow heat exchanger. Then, controller 1100 would cause an electrical current of a controlled level to be applied to the TECs to cause them to extract heat from the thermal transfer fluid flowing in secondary side of the counter-flow heat exchanger, and to add heat to the thermal transfer fluid flowing in the primary side of the counter-flow heat exchanger, thereby cooling the thermal transfer fluid flowing to thermal head 1020 by a controlled amount. The operation of TECs disposed between the primary and the secondary sides of counter-flow heat exchangers is disclosed in U.S. Pat. No. 4,065,936, which patent is incorporated herein by reference.

Thus, as one of ordinary skill in the art can readily appreciate from the description above, controller 1100 controls the operation of apparatus 1000 to set TT4 to one or more predetermined temperatures and to maintain TT4 at the predetermined temperatures for predetermined amounts of time, which operation may be set by logic or software that controls the operation of controller 1100 in the manner described above. In addition, and in accordance with one or more embodiments of the present invention, controller 1100 may control a sequence of temperature changes in accordance with a "recipe" or "script" or "profile" that may be input using an operator interface terminal in accordance with any one of a number of methods that are well known to those of ordinary skill in the art. For example, and without limitation, in accordance with one or more embodiments of the present invention, controller 1100 may execute software that interfaces to an operator via an operator interface terminal. The software may include a commercial operating system such as, for example and without limitation, an appropriate version of a Windows™ operating system and custom software developed routinely and without undue experimentation by one of ordinary skill in the art to perform functions of controller 1100. In accordance with one or more such embodiments, a touch screen may be used to simplify operation, but a keyboard/mouse interface may be used as well. As will be readily appreciated by one of ordinary skill in the art, a variety of other software environments and user interfaces could also be used. In accordance with one or more such embodiments, the software may enable "profiles" to be defined and stored, which profiles specify temperatures, how long to maintain the temperatures, and how to change to new temperatures. Typically, this can be time related, or advanced by signals from an external source, such as automatic test equipment used to test DUT 1010. Thus, in accordance with one or more such embodiments, controller 1100 determines when and how long to maintain the temperature of thermal head 1020, and causes that to occur. In accordance with one or more further embodiments of the present invention, controller 1100 operates in response to one or more testing criteria, operating conditions, or feedback signals. For example, in addition to the description above, controller 1100 may operate in response to any of the following: a test temperature setting associated with a current testing specification for DUT 1010; an input signal utilized by DUT 1010, for example and without limitation, an input power signal, an input voltage, or an input current; a signal indicative of a real-time operating temperature of DUT 1010; a signal indicative of a real-time operating temperature of an internal component of DUT 1010, for example and without limitation, a semiconductor die; an RF signature of the DUT; or the like. In accordance with one or more embodiments of the present invention, controller 1100 communicates with a test control system. In accordance with one or more such embodiments, the test control system would carry out appropriate tests on DUT 1010 while apparatus 1000 would control the temperature of thermal head 1020. As such, these two control systems might communicate or otherwise coordinate their activities. In accordance with one or more further embodiments of the present invention, the two systems are separate and have no direct communication, and in accordance with one or more still further embodiments of the present invention, the two systems are fully integrated.

As one of ordinary skill in the art will readily appreciate, the channels and/or conduits for flow of thermal transfer fluid between the components of apparatus 1000 described may be, for example and without limitation, smooth-bore PTFE hose with stainless steel wire braid reinforcing (available from McMaster-Carr Corporation of Los Angeles, Calif.). In addition, as was described above, temperatures TT1 and TT2 of hot path 1080 and cold path 1090, respectively, refer to temperatures of at least a portion of the paths, for example and without limitation, a portion of the paths between the valve assembly and junction 1240 that pass through the heat exchangers.

Figure 3:
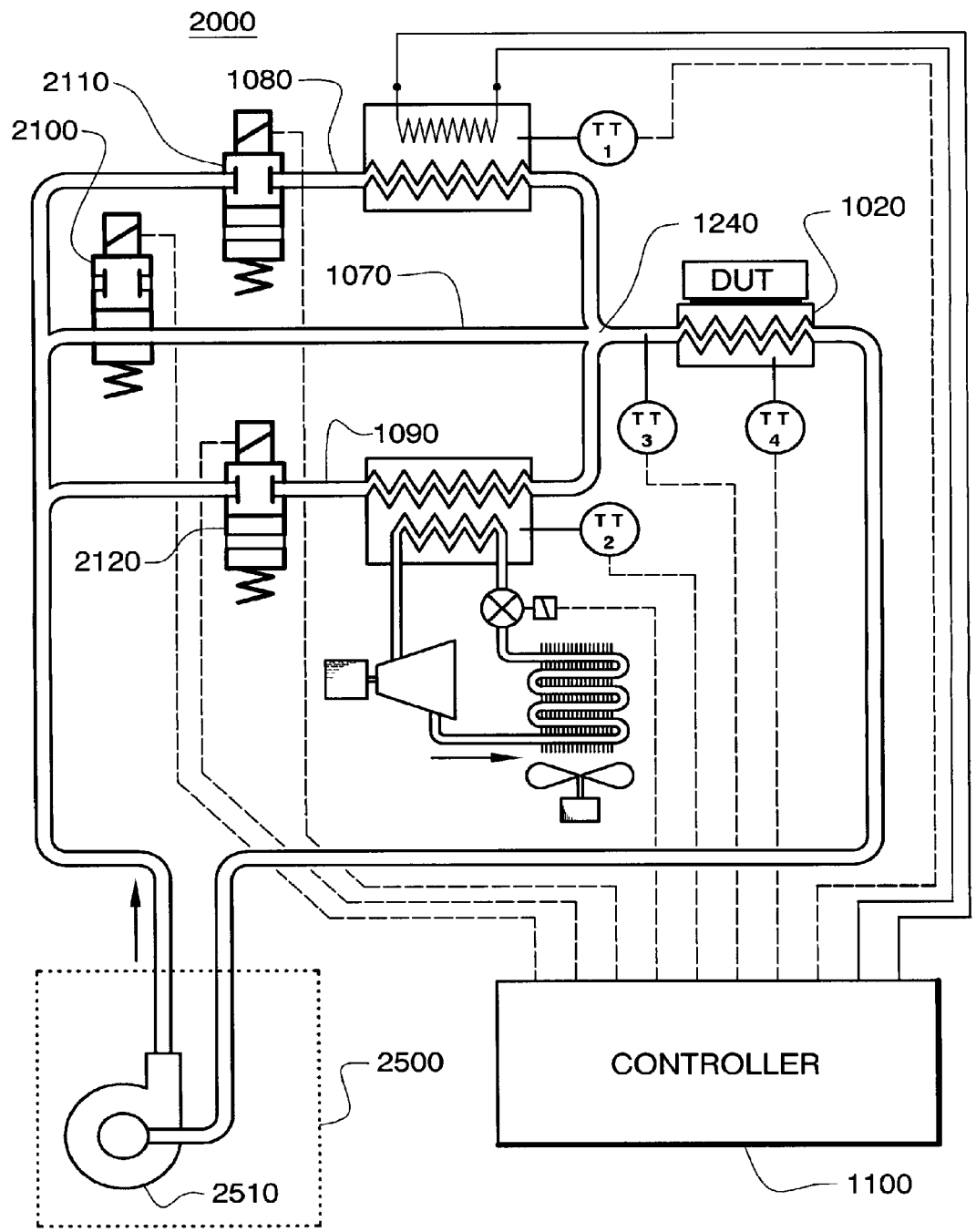
FIG. 3 is a schematic representation of an apparatus useful to control temperature of a device under test ("DUT"), which apparatus is fabricated in accordance with one or more further embodiments of the present invention.

FIG. 3 is a schematic representation of apparatus 2000 that is fabricated in accordance with one or more further embodiments of the present invention, which apparatus 2000 is useful to control temperature (for example and without limitation, set and maintain temperature) of DUT 1010. Apparatus 2000 shown in FIG. 3 is the same as apparatus 1000 shown in FIG. 1 except that pump unit 2500 of apparatus 3000 is used in place of pump assembly 525 of apparatus 1000, and pulse-width modulated valves 2100, 2110, and 2120 are used in place of proportioning valve 1060 of apparatus 1000—as such, the same numbers are utilized for the same components in FIGS. 1 and 3. It should be noted that pulse-width modulated valves 2100, 2110, and 2120 may also be referred to herein as a valve assembly that operates in response to controller 1100. Thus, in accordance with one or more embodiments of the present invention, and as shown in FIG. 3, pulse-width modulated valves 2100, 2110, and 2120 are used to control flow of thermal transfer fluid into straight-through path 1070, hot path 1080, and cold path 1090, respectively. As further shown in FIG. 3, thermal transfer fluid exhausted from thermal head 1020 of a test head is pumped back to valves 2100, 2110, and 2120, which valves are connected in parallel.

Pulse width modulated valves 2100, 2110, and 2120 are shown in FIG. 3 in a configuration wherein thermal transfer fluid is circulated from valve 2100 to straight-through path 1070, through junction 1240, through thermal head 1020 of a test head, through pump unit 2500, and back to valve 2000. In an ideal case, no heat is gained or lost by the thermal transfer fluid as it circulates. In apparatus 2000 shown in FIG. 3, pump 2510 is exposed to thermal transfer fluid at the temperature at which it is exhausted from thermal head 1020 of the test head, thereby heating or cooling pump unit 2500 to the temperature of the circulating thermal transfer fluid. A counter-flow heat exchanger may be necessary in the fluid circuit to and/or from pump 2510 in embodiments for which a range of temperature from that of hot path 1080 to that of cold path 1090 is relatively large. Thus, heat capacity and temperature limits of pump unit 2500 determine the need to use a counter-flow heat exchanger in pump unit 2500 in the manner that counter-flow heat exchanger 530 was used in pump assembly 525 of apparatus 1000 shown in FIG. 1. For example, and without limitation, if the temperature of thermal transfer fluid flowing from thermal head 1020 exceeds either the high temperature limit or the low temperature limit of pump 2510, then one would need to use a counter-flow heat exchanger. In addition, it should be readily appreciated by those of ordinary skill in the art that the various alternatives discussed above with respect to apparatus 1000 shown in FIG. 1 are also applicable to apparatus 2000 shown in FIG. 3.

In accordance with one or more embodiments of the present invention, the thermal transfer fluid is liquid 3M™ FLUORINERT™ Electronic Liquid FC-77, a fluorocarbon based fluid. In addition, in accordance with one or more such embodiments, pump 2510 is a gear pump available from Micropump, Inc. of Vancouver, Wash., and suitable pulse-width modulating valves are available from Parker Hannifin Corporation of Cleveland, Ohio. The flow of the FLUORINERT™ fluid to each of hot path 1080, straight-path 1070, and cold path 1090 is regulated by controller 1100 causing activation of each of valves 2110, 2100, and 2120, respectively. To do this, controller 1100 causes appropriate pulse width modulated excitation signals to be applied to the valves. For example, and without limitation, an electrical excitation having a short pulse width causes a valve to open momentarily, allowing a controlled amount of FLUORINERT™ thermal transfer fluid to flow into a selected path. Advantageously, a pulse width modulated valve is able to open and close at about 10 times per second, allowing accurate control of the average flow rate through the valve. Thus, in accordance with one or more such embodiments of the present invention, controller 1100 causes pulses to be supplied to one or more of the valves to regulate temperature TT3 of the thermal transfer fluid that flows to thermal head 1020 of the test head, thereby controlling temperature TT4 of thermal head 1020.

As was described above, in fabricating one or more embodiments of the present invention, one may utilize a heat transfer apparatus that is a thermal head (described above) wherein a thermal transfer fluid flows through the thermal head and, to effectuate heat transfer, a device is brought into thermal contact with the thermal head. It should be understood by one of ordinary skill in the art that the term thermal contact refers to contact between a first and a second constituent whereby heat may be transferred therebetween primarily by conduction, even indirectly (i.e., by conduction through intermediary materials). However, in fabricating one or more further embodiments of the present invention, one may utilize a heat transfer apparatus that comprises a structure which includes a chamber (for example and without limitation, a test chamber), which chamber is suitable to contain the device or a portion of the device, and which structure may further include conduit(s) to and/or from the chamber, wherein thermal transfer fluid flows through the chamber (and conduits). In accordance with one or more such embodiments, the thermal transfer fluid may come into thermal contact (for example and without limitation, direct contact) with the device or a portion of the device. Further, in accordance with one or more such embodiments, the chamber may be a vacuum tight sealed chamber. Still further, in accordance with one or more such embodiments, the thermal transfer fluid may be, in addition to any other thermal transfer fluid described herein, for example, and without limitation, helium, helium mixtures, nitrogen, carbon dioxide, hydrogen, mixtures of the foregoing, or an inert gas or gases other than helium.

Further, although embodiments of the present invention were described wherein a thermal head was utilized, it should be understood by one of ordinary skill in the art that the term thermal head may include thermal heads whose purpose is not only to regulate temperature but to include apparatus for carrying out any one of a number of tests that are well known to those of ordinary skill in the art.

Embodiments have been described above for controlling temperature of a device under test ("DUT") wherein the device under test is functionally tested by automatic test equipment, and wherein the DUT is, for example and without limitation, a packaged integrated circuit ("IC") device or a die of a semiconductor wafer. However, it should be understood by those of ordinary skill in the art that method and apparatus fabricated in accordance with one or more embodiments of the present invention may apply to a variety of different fields, applications, industries, and technologies. As such, one or more embodiments of the present invention can be used with any system in which temperature is either set and/or controlled. This includes many different processes and applications involved in semiconductor fabrication, testing, and operation.

Embodiments of the present invention described above are exemplary. As such, many changes and modifications may be made to the disclosure set forth above while remaining within the scope of the invention. In addition, materials, methods, and mechanisms suitable for fabricating embodiments of the present invention have been described above by providing specific, non-limiting examples and/or by relying on the knowledge of one of ordinary skill in the art. Materials, methods, and mechanisms suitable for fabricating various embodiments or portions of various embodiments of the present invention described above have not been repeated, for sake of brevity, wherever it should be well understood by those of ordinary skill in the art that the various embodiments or portions of the various embodiments could be fabricated utilizing the same or similar previously described materials, methods or mechanisms. Further, as is apparent to one skilled in the art, the embodiments may be used for making connections to semiconductor devices, electronic devices, electronic subsystems, cables, and circuit boards and assemblies.

As one or ordinary skill in the art will readily appreciate, one or more embodiments of the present invention may include any number of fluid seals, gaskets, adhesives, washers, or other elements that function to seal the assembly and to prevent thermal transfer fluid from leaking (internally or externally).

The scope of the invention should be determined with reference to the appended claims along with their full scope of equivalents.

What is claimed is:

1. An apparatus to control a temperature of a device, which apparatus comprises:
    a thermal head fluid path adapted to be in thermal contact with the device, the thermal head fluid path being disposed to receive thermal transfer fluid from a combined path and to output thermal transfer fluid fluidly to a pump assembly;
    a temperature sensor in communication with a controller and being operable to sense a temperature in response to the thermal head fluid path;
    the pump assembly being disposed to output the thermal transfer fluid fluidly to each of a first path, a second path, and a third path;
    the first path being fluidly connected at a first end to the output of the pump assembly and at a second end to the combined path, the first path being in thermal contact with a heating assembly;
    the second path being fluidly connected at a first end to the output of the pump assembly and at a second end to the combined path, the second path being in thermal contact with a cooling assembly;
    a third path being fluidly connected at a first end to the output of the pump assembly and at a second end to the combined path; and
    a first valve in the first path, a second valve in the second path, and a third valve in the third path; wherein:
    the first, second, and third valves are operable, in response to the controller, to control thermal transfer fluid flow through the first, second, and third paths.

2. The apparatus of claim 1 further comprising:
    a thermal head having the thermal head fluid path disposed therethrough.

3. The apparatus of claim 2 wherein the temperature is a temperature of the thermal head.

4. The apparatus of claim 3 further comprising:
    a first path temperature sensor in communication with the controller and being operable to sense a temperature in response to the first path; and
    a second path temperature sensor in communication with the controller and being operable to sense a temperature in response to the second path;
    wherein:
    the heating assembly is operable, in response to the controller; and
    the cooling assembly is operable, in response to the controller.

5. The apparatus of claim 1 wherein one or more of the first, second and third valves is a pulse-width modulated valve.

6. The apparatus of claim 1 which further comprises a counter-flow heat exchanger disposed so that, in operation, thermal transfer fluid from the thermal head fluid path flows through a primary side of the counter-flow heat exchanger and thermal transfer fluid in the third path flows through a secondary side of the counter-flow heat exchanger.

7. The apparatus of claim 1 which further comprises a counter-flow heat exchanger disposed so that, in operation, thermal transfer fluid from the thermal head fluid path flows through a primary side of the counter-flow heat exchanger and thermal transfer fluid output from the pump assembly flows through a secondary side of the counter-flow heat exchanger.

8. The apparatus of claim 1 further comprises a counter-flow heat exchanger disposed so that, in operation, thermal transfer fluid from the thermal head fluid path flows through a primary side of the counter-flow heat exchanger to the pump assembly and thermal transfer fluid flowing between a confluence of the first, second and third paths and the thermal head fluid path flows through a secondary side of the counter-flow heat exchanger.

9. The apparatus of claim 1 which further comprises:
    a heat exchanger in thermal contact with thermal transfer fluid flowing between a confluence of the first, second and third paths and the thermal head fluid path; and
    a heating assembly in thermal contact with the heat exchanger, the heating assembly being operable in response to the controller.

10. The apparatus of claim 1 wherein the heating element is a resistive heater.

11. The apparatus of claim 1 wherein the pump assembly comprises a pump.

12. The apparatus of claim 1 further comprising thermal transfer fluid, the thermal transfer fluid being a gas or a liquid.

13. An apparatus to control a temperature of a device, which apparatus comprises:
- a thermal head fluid path adapted to be thermally contacted to the device;
- a temperature sensor in communication with a controller and being operable to sense a temperature in response to the thermal head fluid path;
- a first path fluidly connected at a first end to a first output of a valve assembly and at a second end to the thermal head fluid path, the first path being in thermal contact with a heating assembly;
- a second path fluidly connected at a first end to a second output of the valve assembly and at a second end to the thermal head fluid path, the second path being in thermal contact with a cooling assembly;
- a third path fluidly connected at a first end to a third output of the valve assembly and at a second end to the thermal head fluid path;
- a pump assembly disposed to receive thermal transfer fluid from the thermal head fluid path and to output the thermal transfer fluid to the valve assembly; and
- the valve assembly being operable, in response to the controller, to control thermal transfer fluid flow from the first, second, and third outputs;

wherein the valve assembly comprises:
- a first valve operable in response to the controller to control the flow of thermal transfer fluid to the first path;
- a second valve operable in response to the controller to control the flow of thermal transfer fluid to the second path; and
- a third valve operable in response to the controller to control the flow of thermal transfer fluid to the third path.

* * * * *